(12) United States Patent
Owen et al.

(10) Patent No.: US 7,638,808 B2
(45) Date of Patent: Dec. 29, 2009

(54) MICRO-REFLECTORS ON A SUBSTRATE FOR HIGH-DENSITY LED ARRAY

(75) Inventors: Mark D. Owen, Beaverton, OR (US); Duwayne R. Anderson, Saint Helens, OR (US); Thomas R. McNeil, Portland, OR (US); Alexander F. Schreiner, Hillsboro, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 126 days.

(21) Appl. No.: 11/084,466

(22) Filed: Mar. 18, 2005

(65) Prior Publication Data
US 2005/0218468 A1    Oct. 6, 2005

Related U.S. Application Data

(60) Provisional application No. 60/554,628, filed on Mar. 18, 2004.

(51) Int. Cl.
*H01L 33/00* (2006.01)
(52) U.S. Cl. .............................. 257/88; 257/98; 257/99; 257/100; 257/E25.02
(58) Field of Classification Search ............... 257/88, 257/98–100
See application file for complete search history.

(56) References Cited

U.S. PATENT DOCUMENTS

| 3,586,959 | A |  | 6/1971  | Eccles et al. |
| 3,936,686 | A |  | 2/1976  | Moore |
| 4,011,575 | A |  | 3/1977  | Groves |
| 4,435,732 | A |  | 3/1984  | Hyatt |
| 4,530,040 | A |  | 7/1985  | Petterson |
| 4,544,642 | A |  | 10/1985 | Maeda et al. |
| 4,595,289 | A |  | 6/1986  | Feldman et al. |
| 4,684,801 | A |  | 8/1987  | Carroll et al. |
| 4,734,714 | A |  | 3/1988  | Takasu et al. |
| 5,003,357 | A |  | 3/1991  | Kim et al. |
| 5,119,174 | A | * | 6/1992 | Chen ........................... 257/98 |
| 5,150,623 | A |  | 9/1992  | Woods |
| 5,195,102 | A |  | 3/1993  | McLean et al. |
| 5,296,724 | A |  | 3/1994  | Ogata et al. |

(Continued)

FOREIGN PATENT DOCUMENTS

DE    8815418    2/1989

(Continued)

OTHER PUBLICATIONS

PCT International Search Report and Written Opinion dated Jun. 7, 2006 for International Application No. PCT/US04/36046, flied Oct. 29, 2004, 6 pages.

(Continued)

*Primary Examiner*—Thien F Tran
(74) *Attorney, Agent, or Firm*—Marger Johnson & McCollom, P.C.

(57) ABSTRACT

The present invention provides an optical array module that includes a plurality of semiconductor devices mounted on a thermal substrate formed with a plurality of openings that function as micro-reflectors, wherein each micro-reflector includes a layer of reflective material to reflect light. Such material preferably is conductive so as to provide electrical connection for its associated semiconductor device.

14 Claims, 7 Drawing Sheets

U.S. PATENT DOCUMENTS

| | | | |
|---|---|---|---|
| 5,397,867 | A | 3/1995 | Demeo |
| 5,418,384 | A | 5/1995 | Yamana et al. |
| 5,424,544 | A | 6/1995 | Shelton et al. |
| 5,436,710 | A | 7/1995 | Uchiyama |
| 5,490,049 | A | 2/1996 | Montalan et al. |
| 5,522,225 | A | 6/1996 | Eskandari |
| 5,554,849 | A | 9/1996 | Gates |
| 5,555,038 | A | 9/1996 | Conway |
| 5,623,510 | A | 4/1997 | Hamilton et al. |
| 5,632,551 | A | 5/1997 | Roney et al. |
| 5,660,461 | A | 8/1997 | Ignatius et al. |
| 5,698,866 | A | 12/1997 | Doiron et al. |
| 5,715,270 | A | 2/1998 | Zediker et al. |
| 5,719,589 | A | 2/1998 | Norman et al. |
| 5,806,965 | A | 9/1998 | Deese |
| 5,857,767 | A | 1/1999 | Hochstein |
| 5,877,899 | A | 3/1999 | Stern et al. |
| 5,880,828 | A | 3/1999 | Nakamura et al. |
| 5,886,313 | A | 3/1999 | Krause et al. |
| 5,892,579 | A | 4/1999 | Elyasaf et al. |
| 5,910,706 | A * | 6/1999 | Stevens et al. ............... 313/498 |
| 6,033,087 | A | 3/2000 | Shozo et al. |
| 6,058,012 | A | 5/2000 | Cooper et al. |
| 6,065,854 | A | 5/2000 | West et al. |
| 6,088,185 | A | 7/2000 | Ratliff et al. |
| 6,115,184 | A | 9/2000 | Hubble, III et al. |
| 6,118,383 | A | 9/2000 | Hegyi |
| 6,141,040 | A | 10/2000 | Toh |
| 6,155,699 | A | 12/2000 | Miller et al. |
| 6,163,036 | A | 12/2000 | Taninaka et al. |
| 6,200,134 | B1 | 3/2001 | Kovac et al. |
| 6,252,351 | B1 | 6/2001 | Koizumi et al. |
| 6,273,596 | B1 | 8/2001 | Parkyn, Jr. |
| 6,290,382 | B1 | 9/2001 | Bourn et al. |
| 6,291,839 | B1 | 9/2001 | Lester |
| 6,318,886 | B1 | 11/2001 | Stopa et al. |
| 6,319,425 | B1 | 11/2001 | Tasaki et al. |
| 6,325,524 | B1 | 12/2001 | Weber et al. |
| 6,328,456 | B1 | 12/2001 | Mize |
| 6,330,017 | B1 | 12/2001 | Suzuki |
| 6,346,771 | B1 | 2/2002 | Salam |
| 6,357,904 | B1 | 3/2002 | Kawashima |
| 6,366,017 | B1 | 4/2002 | Antoniadis et al. |
| 6,367,950 | B1 | 4/2002 | Yamada et al. |
| 6,373,635 | B1 | 4/2002 | Fujimoto et al. |
| 6,375,340 | B1 | 4/2002 | Biebl et al. |
| 6,419,384 | B1 | 7/2002 | Lewis et al. |
| 6,420,199 | B1 | 7/2002 | Coman et al. |
| 6,439,888 | B1 | 8/2002 | Boutoussov et al. |
| 6,450,664 | B1 | 9/2002 | Kelly |
| 6,459,919 | B1 | 10/2002 | Lys et al. |
| 6,480,389 | B1 | 11/2002 | Shie et al. |
| 6,498,355 | B1 | 12/2002 | Harrah et al. |
| 6,525,335 | B1 | 2/2003 | Krames et al. |
| 6,534,791 | B1 | 3/2003 | Hayashi et al. |
| 6,536,923 | B1 | 3/2003 | Merz |
| 6,541,800 | B2 | 4/2003 | Barnett et al. |
| 6,545,808 | B1 | 4/2003 | Ehbets et al. |
| 6,547,249 | B2 | 4/2003 | Collins, III et al. |
| 6,554,451 | B1 | 4/2003 | Keuper |
| 6,561,640 | B1 | 5/2003 | Young |
| 6,561,808 | B2 | 5/2003 | Neuberger |
| 6,573,536 | B1 | 6/2003 | Dry |
| 6,577,332 | B2 * | 6/2003 | Osawa et al. ................ 347/241 |
| 6,578,986 | B2 | 6/2003 | Swaris et al. |
| 6,578,989 | B2 | 6/2003 | Osumi et al. |
| 6,607,286 | B2 | 8/2003 | West et al. |
| 6,630,689 | B2 | 10/2003 | Bhat et al. |
| 6,683,421 | B1 | 1/2004 | Kennedy et al. |
| 6,686,581 | B2 | 2/2004 | Verhoeckx et al. |
| 6,708,501 | B1 | 3/2004 | Ghoshal et al. |
| 6,724,473 | B2 | 4/2004 | Leong et al. |
| 6,746,295 | B2 | 6/2004 | Sorg |
| 6,759,803 | B2 | 7/2004 | Sorg |
| 6,796,698 | B2 | 9/2004 | Sommers et al. |
| 6,800,500 | B2 | 10/2004 | Coman et al. |
| 6,815,724 | B2 | 11/2004 | Dry |
| 6,822,991 | B2 | 11/2004 | Collins, III et al. |
| 6,831,303 | B2 | 12/2004 | Dry |
| 6,834,963 | B2 | 12/2004 | Kim et al. |
| 6,857,767 | B2 | 2/2005 | Matsui et al. |
| 6,880,954 | B2 | 4/2005 | Ollett et al. |
| 6,882,331 | B2 | 4/2005 | Wu |
| 6,930,870 | B2 | 8/2005 | Nobe et al. |
| 6,937,754 | B1 | 8/2005 | Eguchi |
| 6,992,335 | B2 | 1/2006 | Ohkawa |
| 6,995,348 | B2 | 2/2006 | Bradley et al. |
| 7,009,165 | B2 | 3/2006 | Hehemann et al. |
| 7,071,493 | B2 | 7/2006 | Owen et al. |
| 7,102,172 | B2 | 9/2006 | Lynch et al. |
| 7,179,670 | B2 | 2/2007 | Shelton et al. |
| 2001/0002120 | A1 | 5/2001 | Bessendorf et al. |
| 2001/0030782 | A1 | 10/2001 | Trezza |
| 2001/0046652 | A1 | 11/2001 | Ostler et al. |
| 2002/0187454 | A1 | 12/2002 | Melikechi et al. |
| 2003/0038943 | A1 | 2/2003 | Almarzouk et al. |
| 2003/0209714 | A1 | 11/2003 | Taskar et al. |
| 2003/0230765 | A1 | 12/2003 | Dry |
| 2004/0000677 | A1 | 1/2004 | Dry |
| 2004/0011457 | A1 | 1/2004 | Kobayashi et al. |
| 2004/0026721 | A1 | 2/2004 | Dry |
| 2004/0041521 | A1 | 3/2004 | Mandler et al. |
| 2004/0057873 | A1 | 3/2004 | Yerazunis et al. |
| 2004/0090794 | A1 | 5/2004 | Ollett et al. |
| 2004/0113549 | A1 | 6/2004 | Roberts et al. |
| 2004/0119084 | A1 | 6/2004 | Hsieh et al. |
| 2004/0134603 | A1 | 7/2004 | Kobayashi et al. |
| 2004/0135159 | A1 | 7/2004 | Siegel |
| 2004/0141326 | A1 | 7/2004 | Dry |
| 2004/0166249 | A1 | 8/2004 | Siegel |
| 2004/0195947 | A1 | 10/2004 | Clark et al. |
| 2004/0201995 | A1 | 10/2004 | Galli |
| 2004/0206970 | A1 | 10/2004 | Martin |
| 2004/0238111 | A1 | 12/2004 | Siegel |
| 2005/0087750 | A1 | 4/2005 | Braddell et al. |
| 2005/0098299 | A1 | 5/2005 | Goodson et al. |
| 2005/0152146 | A1 | 7/2005 | Owen et al. |
| 2005/0230600 | A1 | 10/2005 | Olson et al. |
| 2005/0231713 | A1 | 10/2005 | Owen et al. |
| 2005/0253252 | A1 | 11/2005 | Owen et al. |
| 2005/0285129 | A1 | 12/2005 | Jackson, III et al. |
| 2006/0216865 | A1 | 9/2006 | Owen et al. |

FOREIGN PATENT DOCUMENTS

| | | |
|---|---|---|
| EP | 146998 A1 | 7/1985 |
| EP | 0935145 | 8/1999 |
| EP | 1158761 | 11/2001 |
| EP | 1467416 A2 | 10/2004 |
| EP | 1469529 A2 | 10/2004 |
| EP | 1502752 A2 | 2/2005 |
| EP | 1526581 A2 | 4/2005 |
| GB | 2224374 | 5/1990 |
| GB | 2396331 A1 | 6/2004 |
| GB | 2399162 A | 9/2004 |
| JP | 2003268042 A | 9/2003 |
| JP | 2004-198536 | 7/2004 |
| JP | 2004-297052 | 10/2004 |
| WO | 9716679 | 5/1997 |
| WO | 0037904 | 6/2000 |
| WO | 0102846 | 1/2001 |
| WO | 0206723 | 1/2002 |
| WO | 0213231 | 2/2002 |
| WO | 0226270 | 4/2002 |

| | | | |
|---|---|---|---|
| WO | WO03096387 A2 | 11/2003 |
| WO | WO2004009318 A1 | 1/2004 |
| WO | WO2004011848 C2 | 2/2004 |
| WO | WO2004038759 A2 | 5/2004 |
| WO | WO2004049462 A1 | 6/2004 |
| WO | WO2004078477 A1 | 9/2004 |
| WO | WO2004084316 A2 | 9/2004 |
| WO | WO2004/097947 A2 | 11/2004 |
| WO | WO2004097516 A2 | 11/2004 |
| WO | WO2004100343 A2 | 11/2004 |
| WO | WO2005/089477 | 3/2005 |
| WO | WO2005036054 A1 | 4/2005 |
| WO | WO05043598 A2 | 5/2005 |
| WO | WO2005041632 A2 | 5/2005 |
| WO | WO2005043954 A2 | 5/2005 |
| WO | WO2005091392 | 9/2005 |
| WO | WO2005094390 A2 | 10/2005 |
| WO | WO2005100961 A2 | 10/2005 |
| WO | WO20050101535 A2 | 10/2005 |
| WO | WO2006072071 A2 | 7/2006 |

OTHER PUBLICATIONS

Examiner cited in related U.S. Appl. No. 10/984,589, filed Nov. 8, 2004—Electromagnetic Spectrum, 1 page, printed Aug. 16, 2006 www.brocku.ca/earthsciences/people/gfinn/optical/spectrum.gif.

PCT International Search Report and PCT Written Opinion dated Oct. 13, 2006 for International PCT Application No. PCT/US05/13448, filed Apr. 19, 2005, 8 pages.

PCT International Search Report and PCT Written Opinion dated Sep. 28, 2006 for International PCT Application No. PCT/US05/11216 filed Mar. 30, 2005, 9 pages.

PCT International Search Report and PCT Written Opinion dated Oct. 16, 2006 for International PCT Application No. PCT/US05/09076 filed Mar. 18, 2005, 10 pages.

Not yet published related U.S. Appl. No. 11/342,363, filed Jan. 26, 2006; Specification and Figures; 44 pages.

Not yet published related U.S. Appl. No. 11/434,544, filed May 12, 2006 Specification and Figures; 28 pages.

PCT International Search Report and International Preliminary Examination Report dated Nov. 19, 2003 for International PCT Application No. PCT/US03/14625, filed May 8, 2003, 6 pages.

PCT International Search Report and Written Opinion dated Jun. 3, 2005 for International PCT Application No. PCT/USO4/36260, filed Oct. 28, 2004, 5 pages.

PCT International Search Report and Written Opinion dated Jun. 17, 2005 for International PCT Application No. PCT/USO4/36370, filed Nov. 1, 2004, 6 pages.

PCT International Search Report and Written Opinion dated Aug. 26, 2005 for International PCT Application No. PCT/US05/09407, filed Mar. 18, 2005, 11 pages.

PCT International Preliminary Report on Patentability dated Sep. 28, 2006 for International PCT Application No. PCT/US05/09407, filed Mar. 18, 2005, 9 pages.

Siegel, S.—Curing with UV LED's—abstract only—IS&T's NIP19: 2003 International Conference on Digital Printing Technologies, p. 365, 1 sheet.

Not yet published related U.S. Appl. No. 11/614,753, filed Dec. 21, 2006; Specification and Figures; 58 pages.

PCT International Search Report and Written Opinion dated Feb. 6, 2007 for International PCT Application No. PCT/US05/12608, filed Apr. 12, 2005, 8 pages.

Supplemental European Search Report and written opinion for corresponding EU application No. EP03724539, dated Nov. 21, 2007, 8 pages total.

U.S. Patent & Trademark Office International Search Report and Written Opinion dated Aug. 26, 2005 for International Application No. PCT/US05/09407, filed Mar. 18, 2005, 11 pages.

* cited by examiner

MICRO-REFLECTORS ON A SUBSTRATE FOR HIGH-DENSITY LED ARRAY

RELATED APPLICATIONS

This application claims priority from U.S. Provisional Application Ser. No. 60/554,628, filed Mar. 18, 2004, the contents of which are hereby incorporated by reference as recited in full herein for all purposes.

BACKGROUND OF THE INVENTION

This invention relates to high-density light emitting diode (LED) arrays and, more particularly, to an LED array that has improved collection and collimation of light.

High-density UV LED arrays may be used for a variety of applications, including, e.g., curing applications ranging from ink printing to the fabrication of DVDs and lithography. Many such applications require a high optical power density at the working surface. However, such power density tends to be unavailable from a typical LED as such LED alone generally is characterized by light distribution that is undesirably divergent.

For example, FIG. 1 is a graphic illustration showing radiation distribution for two typical LEDs 22, 24 mounted on a surface 26 without refractive or reflective optics. Ideally, particularly for applications as above described, the light from the LEDs 22, 24 would be distributed substantially 90 degrees from substrate 26. However, the LEDs 22, 24 will typically emit highly divergent light. In FIG. 1, this is illustrated by curves 28 and 30. Curve 28 is a representative example of radiation distribution from first LED 22 and curve 30 is a representative example of radiation distribution from second LED 24. Because much of radiation from LEDs 22, 24 is emitted at highly oblique angles, the optical power density falls off relatively quickly as a function of the distance of the work surface from the LED. This fall off is graphically illustrated in FIG. 2 for an LED array without refractive or reflective optics.

Typically, the performance illustrated by FIGS. 1 and 2 may vary as the system is changed. For example, the performance would tend to vary if different LEDs are used and if the LEDs are placed in different arrays (e.g., depending on the number and spacing of LEDs in the array). In any case, particularly for the aforementioned applications, divergence and fall off similar to that illustrated by FIGS. 1 and 2 will tend to be undesirable.

To achieve the optical power density typically required in the aforementioned applications, an LED array exhibiting such divergence could and often is located physically close to the work surface. That is, the proximity of the array to the work surface would be closer than if the array did not exhibit such divergence. Moreover, such close proximity generally is undesirable, including because it will typically necessitate mechanical changes to tooling and/or shielding to accommodate such proximity. However, locating the LED array too far from the work surface may diminish the optical power density to undesired levels, which levels may hinder or preclude proper operation in the application.

There are known methods of achieving higher optical power density. For example, some LEDs are used with Lambertian optical outputs to achieve a higher optical power density. However, such devices are less efficient in electrical to optical conversions as well as being less thermally efficient. Another method of achieving higher optical power density is shown if FIG. 3 in which an array of refractive optical elements 32 is located above an array of LEDs 34 in which each LED 34 is associated with an optical element 32. Each optical element 32 collects and collimates the light from its associated LED 34. However, this method is inefficient because light from LEDs is highly divergent causing much of the light to fall outside the numerical aperture of the lenses. The numerical aperture of a lens is defined as the sine of the angle between the marginal ray (the ray that exits the lens system at its outer edge) and the optical axis multiplied by the index of refraction (n) of the material in which the lens focuses. In order to more effectively collect and collimate the light the optical component must have a very high numerical aperture resulting in a lens that has a very large diameter and a very short focal length. In practice, it is not possible to manufacture a refractive optical element that collects all of the light from an LED because that would require the angle between the optical axis and the marginal ray to be 90 degrees, implying a lens of either a zero focal length or an infinite diameter.

Another common approach to collecting and collimating light from an LED is to use a parabolic reflector as shown in FIG. 4. AN LED 36 is mounted in parabolic reflector 38 so that light rays 40 emitted from LED 36 are collected and collimated. Unlike refractive optics, reflective optics generally collect all the light from the LED, even at very highly oblique angles. However, known reflective optics are not used in a tightly packed or dense array because of their size. For example, a typical application of such reflective optics is with LED-mounted flashlights in which the reflective optic collimates light from only a single LED.

Additionally, in known optical devices the reflector is separate from the electrical circuitry of the device. For example, such devices typically utilize a macro-reflector for an entire array of LEDs. The optical efficiency of these devices is lowered because each LED does not have an associated reflector. Additionally, the volume of space required for the macro-reflector is very large which increases the cost of manufacturing.

SUMMARY OF THE INVENTION

The present invention provides an LED array using micro-reflectors. The micro-reflectors, generally, collect and collimate light from the LED array. In doing so, the micro-reflectors enhance the array's optical power. In typical applications, the LED array benefits from such enhanced optical power in that it may be physically located further away from a work surface and yet deliver optical power sufficient to enable proper operation.

In one aspect, the present invention provides a dense LED array in which each LED of such array is mounted in a micro-reflector. Accordingly, an array of micro-reflectors. The micro-reflectors typically are formed in a substrate. Preferably, the substrate is of a material that is electrically insulating. Preferably, the substrate is also thermally conductive.

In one embodiment, the substrate is a crystalline silicon having defined crystallographic axes along which the substrate is etched to form openings in the substrate. These openings have walls with a characteristic slope, so as to have a substantially truncated pyramidal shape. The openings are metallized and otherwise structured to define selected circuits. The resulting substrate has openings formed in a dense array, which openings are coated with a reflective material so that the openings function as micro-reflectors. Preferably, the reflective material is also electrically conductive so that the openings also function as electrical connectors (e.g., if coupled to power or to ground).

In this embodiment, one or more LEDs are mounted within each micro-reflector and wired into a circuit on the substrate. The LEDs of the array is electrically connected to a power source, with the micro-reflector preferably providing electrical connection to the associated LEDs (e.g., the reflector being coupled to either power or to ground).

The substrate may be formed of any size and the LEDs arranged in any desired dense configuration required for a particular application.

In another embodiment, a dense LED array is provided in which an array of micro-reflectors is formed using a substrate of other than silicon, such as an insulator, a semiconductor, a conductor, or combinations of one or more of these or other materials. As examples, the substrate may be glass, ceramic, diamond, SiC, AlN, BeO, Al2O3, or combinations of these or other materials.

Micro-reflectors may be formed using various technologies. As examples, the micro-reflectors may be formed using lithographical technology, machining, stamping, casting, forging, or other processes, or combinations of one or more of these. To illustrate, micro-reflectors may be machined into the substrate and/or otherwise formed (e.g., such machining via lasers and/or plasma). To further illustrate, micro-reflectors may be formed by a combination of etching, together with machining or other technology. In this illustration, a substrate may be etched to form openings. Each opening is then machined to a desired shape, such as a parabolic shape. Such machining may be performed before or after the substrate, including the openings, is coated with a reflective material.

Micro-reflectors may be formed having various shapes. Generally, the shape is selected so as to optimize the optical power density. While parabolic micro-reflectors are typical, micro-reflectors may have other shapes. Moreover, the shapes may be varied within any particular array. As such, the micro-reflectors in the array may be patterned.

The present invention provides an array module that includes a plurality of semiconductor devices mounted on a substrate formed with a plurality of openings that function as micro-reflectors, wherein each semiconductor device or multiple devices is associated with a micro-reflector, each micro-reflector including a layer of reflective material to reflect light. Preferably, such reflective material is electrically conductive and coupled so as to provide electrical connection for its associated semiconductor device.

The present invention further provides a method of manufacturing an array module comprising the steps of providing a substrate, forming a plurality of openings in the substrate, providing a layer of reflective material in each opening, and mounting a semiconductor device within each opening so that the layer of reflective material in each opening reflects light. Preferably such material is electrically conductive and coupled so as to provide electrical connection for its associated semiconductor device.

The present invention provides for a method of manufacturing an array module in which a substrate is metallized. Metal circuits are structured on the metallized substrate and the substrate is then etched to form openings. The openings are then metallized to form micro-reflectors that reflect light (and, preferably, that provide electrical connection for an associated semiconductor device). This enables the formation of features in the electrical circuit separately from the etching and plating tasks associated with forming the micro-reflectors.

The present invention further provides an optical device that incorporates a reflector into the electrical circuitry of the optical device so as to obtain higher optical efficiency with lower costs.

These and other embodiments are described in more detail in the following detailed descriptions and the figures.

The foregoing is not intended to be an exhaustive list of embodiments and features of the present invention. Persons skilled in the art are capable of appreciating other embodiments and features from the following detailed description in conjunction with the drawings.

DETAILED DESCRIPTION OF THE INVENTION

Figure 1:
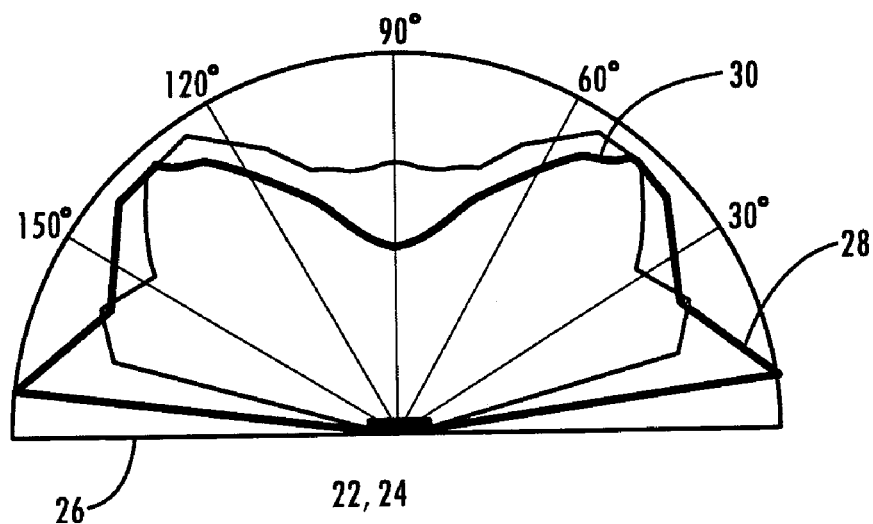
FIG. 1 shows radiation distribution for two LEDs without refractive or reflective optics.

Representative embodiments of the present invention are shown in FIGS. 5-14, wherein similar features share common reference numerals.

In a basic embodiment, an LED array employs micro-reflectors. The micro-reflectors, generally, collect and collimate light from the LED array. In doing so, the micro-reflectors enhance the array's optical power. In typical applications, the LED array benefits from such enhanced optical power in that it may be physically located further away from a work surface and yet deliver optical power sufficient to enable proper operation.

Figure 5:
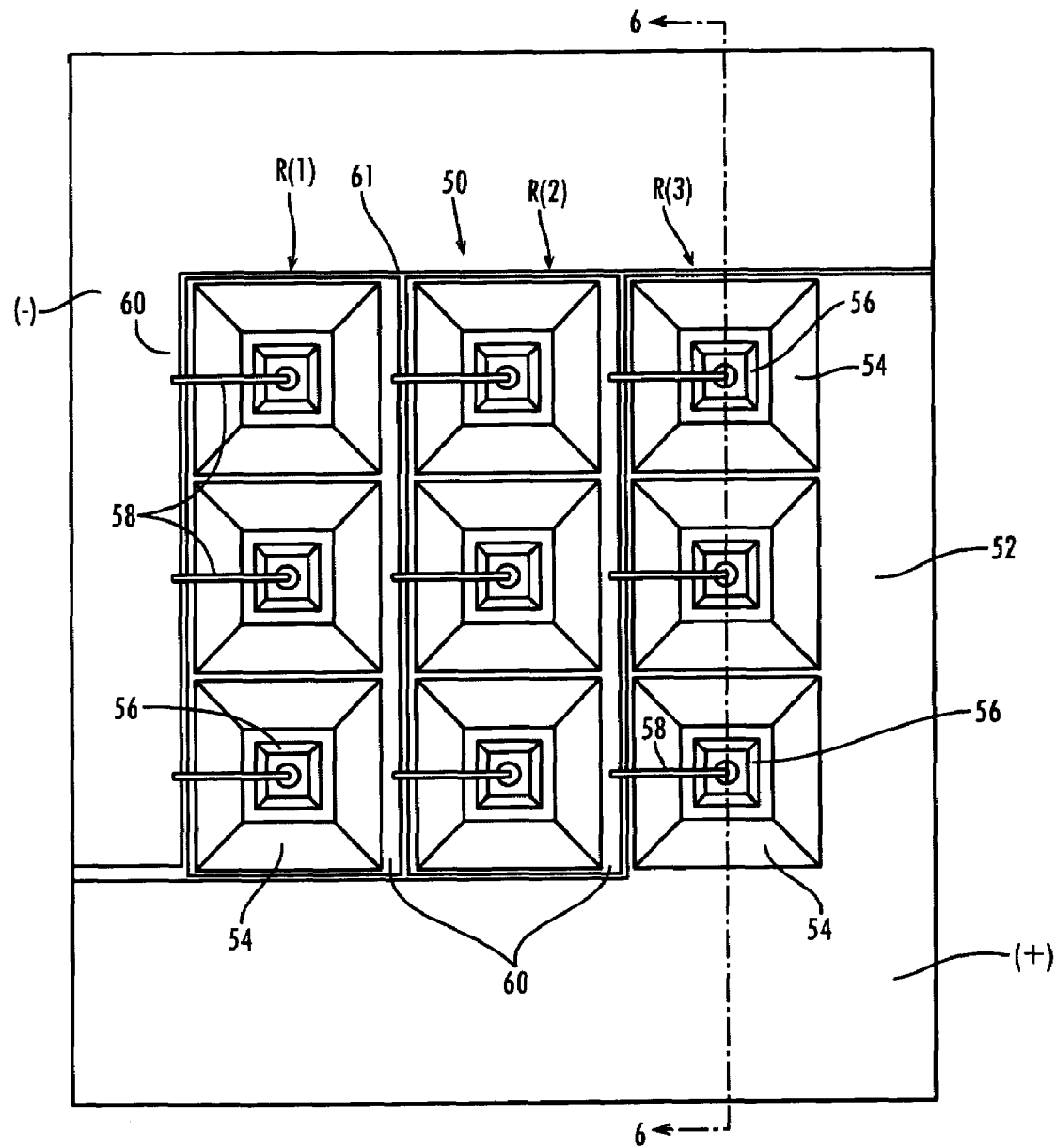
FIG. 5 is an enlarged top view of a portion of an LED array according to one aspect of the present invention.
Figure 6:
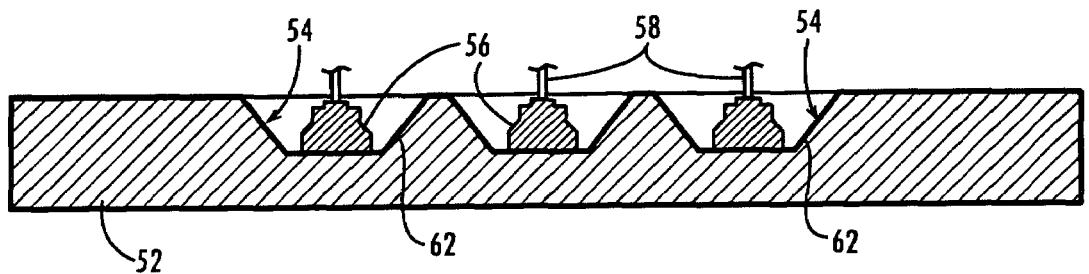
FIG. 6 is a view of the LED array of FIG. 5 taken along line 6-6.

FIG. 5 shows a portion of a dense LED array 50 that may be used for applications requiring high optical power density at the working surface. Such applications may include, for example, curing applications ranging from ink printing to the fabrication of DVDs and lithography. One such LED array is shown and described in U.S. patent application Ser. No. 10/984,589, filed Nov. 8, 2004, the entire contents of which are hereby incorporated by reference for all purposes.

Array 50 includes a substrate 52 having micro-reflectors 54 formed therein. An LED 56 is mounted within each micro-reflector 54 in a manner known by those skilled in the art. Although the figures show only one LED associated with a micro-reflector each micro-reflector may be associated in one or more LEDs, such as one of each red, green, and blue, or other colors, or any combination thereof. One type of LED suitable for use is a P/N C395-XB290-E0400-X, manufactured by Cree, Inc., located in Durham, N.C., USA.

Each LED 56 may be mounted using various technologies. The technologies include, as examples, bonding using a conductive adhesive, soldering, or eutectic bonding.

Each LED 56 is electrically connected to a power source (not shown) through a lead line 58 connected in a known manner to a wire bond pad 60 on substrate 52.

In this embodiment, each row R(1), R(2), R(3) is electrically isolated by an isolation band 61. It is to be understood, however, that the array may provide isolation on a basis other than by row. For example, each LED may be electrically isolated from all other LEDs in the array, or from the immediately surrounding LEDs (e.g., while being electrically connected with selected LEDs adjacent to such surrounding LEDs), or from some other selection of LEDs. In this way, electrically connected LEDs may be provided in a selected pattern throughout or in one or more parts of the array. This isolation/connection may be useful in controlling heating of the LED array, e.g., by selectively reducing power to, or even shutting down individual LEDs or one or more groups of the LEDs, so as to counter undesirable heating. Heating of LED arrays, and methods to handle such heating, including the selective control of power provided to one or more LEDs in such array, are shown and described in U.S. patent application titled "DIRECT COOLING OF LEDS," Attorney Docket number PHO-2.009.US, filed Mar. 18, 2005, claiming priority to U.S. Provisional Application Ser. No. 60/554,632, filed Mar. 18, 2004, the entire contents of which application are hereby incorporated by reference for all purposes.

Each micro-reflector 54 includes a layer 62 of reflective and, preferably, electrically conductive material both to reflect light from and to complete a circuit to electrically connect (e.g., power) an associated LED 56. Various materials may be employed that are both optically reflective and electrically conductive and that can be bonded to electrically. As examples, these materials include copper, aluminum, gold, and silver, or combinations thereof or alloys therewith. This construction provides micro-reflectors 54 that reflect light from an associated LED 56 and that are incorporated into the conductive circuitry to provide electrically connection (e.g., to power) for an associated LED 56. Although it is preferred that the materials used to provide the micro-reflectors are used to both reflect and to provide electrical connection, it is understood that the materials may be used for only one such purpose, e.g., to reflect light, without departing from the principles of the invention.

Substrate 52 is preferably a 1-0-0 crystalline silicon wafer. This wafer has defined crystallographic axes that are determined by silicon's crystalline lattice. One of the consequences of silicon's crystalline nature is that etching of silicon can be made to progress preferentially along some crystallographic axes as compared to others. As a result, when the surface of a silicon wafer is properly oriented, masked to expose the surface to be etched, and placed in an etching solution (such as potassium hydroxide or hydrofluoric acid), openings are etched in the silicon having walls with a characteristic slope, typically of about 54.7 degrees.

Substrate 52 preferably is fabricated using a cleaned and polished 1-0-0 silicon wafer. The wafer surfaces generally are super cleaned to remove contamination. Known cleaning methods include a hydrofluoric acid soak followed by one or more aluminum hydroxide soaks, multiple dump rinses, and a distilled water spin rinse dry in heated dry nitrogen.

A layer (e.g., silicon nitride) is applied to the substrate 52 using generally understood methods, e.g., vapor deposition or plasma enhanced vapor deposition. This layer can be, for example, about 2,400 angstroms. This layer is then coated with photoresist. It is necessary to selectively remove photoresist from wafers prior to etching into the silicon. To do so, the photoresist imaged or exposed with a mask and selected portions of the photoresist are removed using an oxygen plasma (12 cc/min. oxygen flow at 360 watts) or resist stripper (such as Shipley 1112 A), followed by several distilled water rinses. By removing selected photoresist, portions of the substrate's surface are exposed where openings that will become the micro-reflectors are desired. In one embodiment, the silicon surface is prepared to expose a plurality of square shapes having sides measuring about 700 microns (0.028 in.) and spaced apart in a center-to-center spacing of about 800 microns (0.032 in.).

The exposed portions of the layer (e.g., silicon nitride) are then etched. Silicon nitride can be etched with buffered hydrofluoric acid (BHF), which will not attack silicon. An alternative to BHF is reactive ion etch (RIE). One example of the RIE for this application is to etch for 90 seconds at 150 watts and 50 standard cubic centimeters per minute Sulfur Hexafluoride ($SF_6$) at 100 mTorr vacuum. The silicon nitride openings are etched until the base silicon wafer is fully exposed and shiny.

The silicon is then etched. For example, potassium hydroxide (KOH) may be employed as a wet etch that attacks silicon preferentially in the 1-0-0 plane, producing a characteristic anisotropic V-etch with sidewalls that form about a 54.7 degree angle with the surface (35.3 degree from the normal). Adding 1 percent isopropyl alcohol to the KOH solution will lower the surface tension of the solution, typically resulting in smoother etched walls.

The speed of the etch can be adjusted by those skilled in the art. To illustrate, the etch rate can be about 750 angstroms per minute at room temperature using a potassium hydroxide (KOH) solution of 400 grams of KOH per liter of distilled water. At 52 degrees C. the etch rate is about 14 microns per hour.

In this etch process, the etch rate of the silicon nitride layer is about 300 times slower than the etch rate of the silicon. While this may provide sufficient control to protect the silicon nitride, it may be necessary to monitor and adjust the thickness of the silicon nitride layer to ensure that it is properly masking during the entire base silicon wafer etching.

Figure 7:
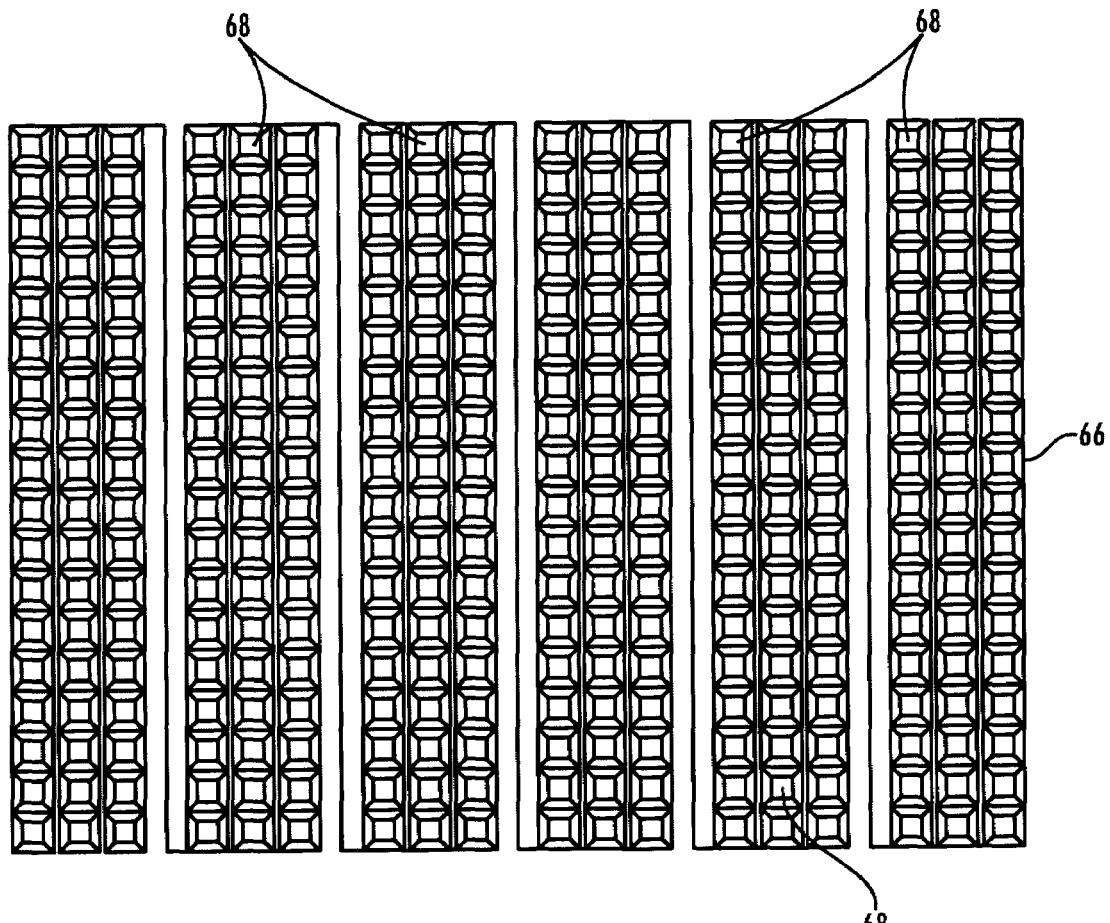
FIG. 7 is a top view of the substrate formed with an array of pockets according to one aspect of the invention.
Figure 8:
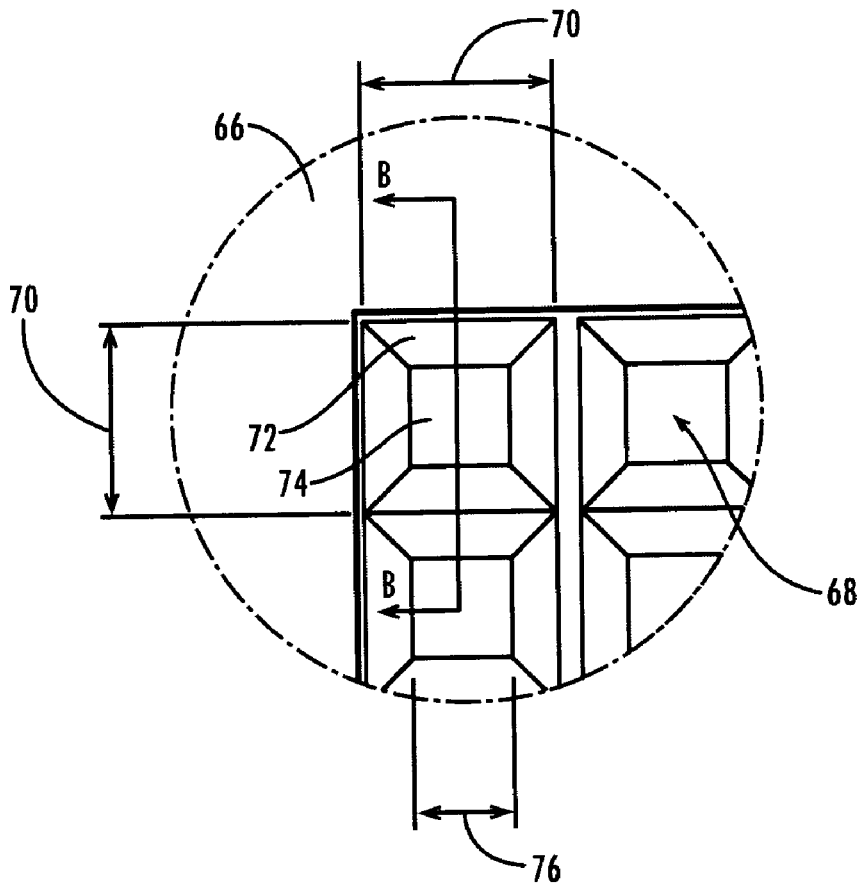
FIG. 8 is an enlarged partial top view of a portion of the substrate of FIG. 7.
Figure 9:
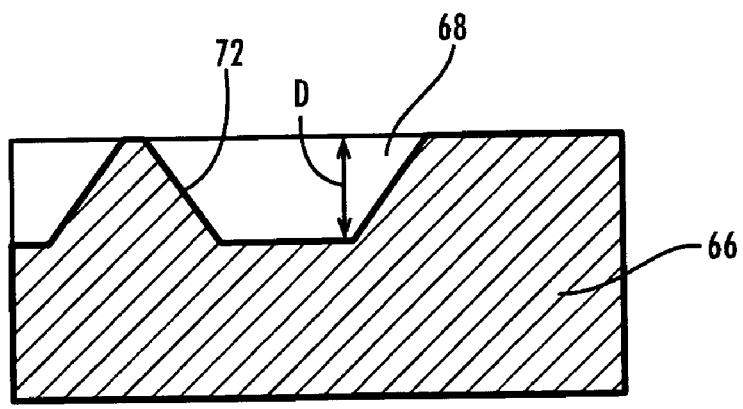
FIG. 9 is an enlarged partial side view of a portion of the substrate of FIG. 7.

The result is a substrate 66 as seen in FIGS. 7-9, having an array of openings 68. In this embodiment, openings 68 are arranged in a densely packed array in a center-to-center spacing of about 800 microns (0.032 in.). Each micro-reflector is formed in a truncated pyramidal shape in which opening 68 has sides having dimensions 70 of about 700 microns (0.028 in.) square. Openings 68 have sidewalls 72 that slope to a base 74 at an angle of about 54.7 degrees from a horizontal plane. Base 74 has a dimension 76 of about 346 microns (0.014 in.) square and openings have a depth (D) of about 250 microns (0.010 in.). These dimensions are merely illustrative and the invention is not limited to an optical device with these dimensions. For example, an optical device may be constructed and arranged so that the micro-reflectors have a center-to-center spacing of about 3 mm or less.

Substrate 52, including the openings 68, is then metallized. In doing so, typically several thin film layers are used. Preferably, the film layers are applied using generally understood methods, e.g., vapor deposition or plasma enhanced vapor deposition. Various layers and combinations of layers may be used. Generally, however, each such layer, and the layer combinations, are selected to address one or more various desirable performance characteristics, including as examples: to reflect light (including light of selected wavelength(s)), to provide electrical connection(s), to provide electrical insulation (including circuit isolation), to provide adhesion of the layers to the substrate, to combat metal migration, and to enhance mounting of the LED in the micro-reflector.

In one possible layer combination, a dielectric coating of about 1000 angstroms of silicon dioxide is applied to isolate the conductive circuit from the semiconductor. An adhesion layer of about 100-500 angstroms of titanium is then applied to improve adhesion of the metal layers. Next, a barrier metal layer of about 100-500 angstroms of nickel is applied to prevent metal migration between the layers. Then, a light reflecting and electrically conducting layer is applied to form both an optical reflector and an electrical circuit. For UV light, this layer can be about 1-10 microns of silver or aluminum and, for visible light, this layer can be about 1-10 microns of gold.

Another possible layer combination is to use 1,000 angstroms of silicon dioxide to isolate the conductive circuit followed by 1,000 angstroms of titanium to improve adhesion of the metal layers. A barrier layer of about 1,000 angstroms of nickel may be applied to prevent metal migration between the layers. Generally, it is not desirable to use heavy nickel layers where the tendency of the nickel is to cause peeling of the metal.

The nickel layer may then by coated with about 6 microns of silver to form the reflective and electrical conductive layer. The nickel and silver material constitute an electrical conductor enabling use of bonding techniques common to fabrication of semiconductor devices, e.g., wire bonding, such as with Au, Ag, Al, thermal adhesives and soldering processes. The heavy silver layer also helps to carry relatively high electrical currents, so as to optimize optical power generation, particularly of UV light. Although it is preferred that the materials used to provide the micro-reflectors are used to both reflect and to provide electrical connection, it is understood that the materials may be used for only one such purpose, e.g., to reflect light, without departing from the principles of the invention.

After the metallization process described above, isolation band 61 is formed so as to form the electrical circuits on the metallized substrate. There are various known methods generally to provide electrical isolation among selected circuit elements or, specifically, to form isolation band 61 to form circuits on metallized substrates. In one example, the isolation is provided via subtractive techniques to remove selected portions of the metal and thereby electrically isolate various circuit elements. In this example, a laser processes may be employed to cut through the selected portion(s) of the metal and, typically, slightly into the silicon. As well, photolithographic processes may be used (e.g., including using photoresist, masking, developing, and etching, such as via a wet or plasma etch) to remove the selected portion(s) of the metal. While the laser processes tend to be flexible and relatively easy to change/adjust as to locations and geometries, the photolithographic process uses existing, well-understood and typically cost-effective fabrication systems. Generally, any of these or other process, alone or in combination, will be suitable.

Generally, one or more LEDs are mounted within each micro-reflector and electrically connected. The LEDs are electrically connected to a power source. Preferably, each micro-reflector provides electrical connection to its associated LEDs (e.g., the reflector being coupled to either power or to ground). Such connection is enabled by use of the metal layers (as described above). In doing so, the metal layers provide a source (or return) electrode. The LEDs typically are also electrically connected to an other feature that provides a return (or source) electrode, so as to complete an electrical circuit. As example this other feature may be the wire bond pad 60 on the surface of the substrate, connected via lead line 58, as described above with reference to FIGS. 5 and 6. In the alternative, this other feature may be provided by the substrate or other material providing the base of the micro-reflector. In such alternative, particularly if the reflective metal layer(s) of the micro-reflector are an electrode, the substrate (and/or other material) is electrically isolated from the associated metal layers of the micro-reflector using one or more appropriate dielectric layers. Moreover, if the micro-reflector is formed in an opening fabricated within a material applied above the substrate (such that the base of the micro-reflector is outside the substrate), that material may provide the other electrode with or without using the substrate in making the return (or source) connection (e.g., the electrical connection may be made via the substrate or via conductive features fabricated on the substrate).

Metallization on the back of the silicon provides for solder attach of, e.g., a supporting structure (not shown), a heat sink (not shown), and/or other circuitry (not shown). The metallization may be a heavy silver layer. This silver layer can be replaced by a flash of gold to protect the nickel. The flash of gold keeps the nickel from oxidizing for improved solderability. The gold will go into solution in the solder. Minimizing the gold thickness will minimize cost while ensuring solderability and will minimize gold embrittlement potential in the solder joint connection between the substrate and, e.g., the supporting structure. Once the substrate has been fully processed the LEDs are mounted and bonded in a known manner (discussed above) to complete the LED array.

Figure 2:
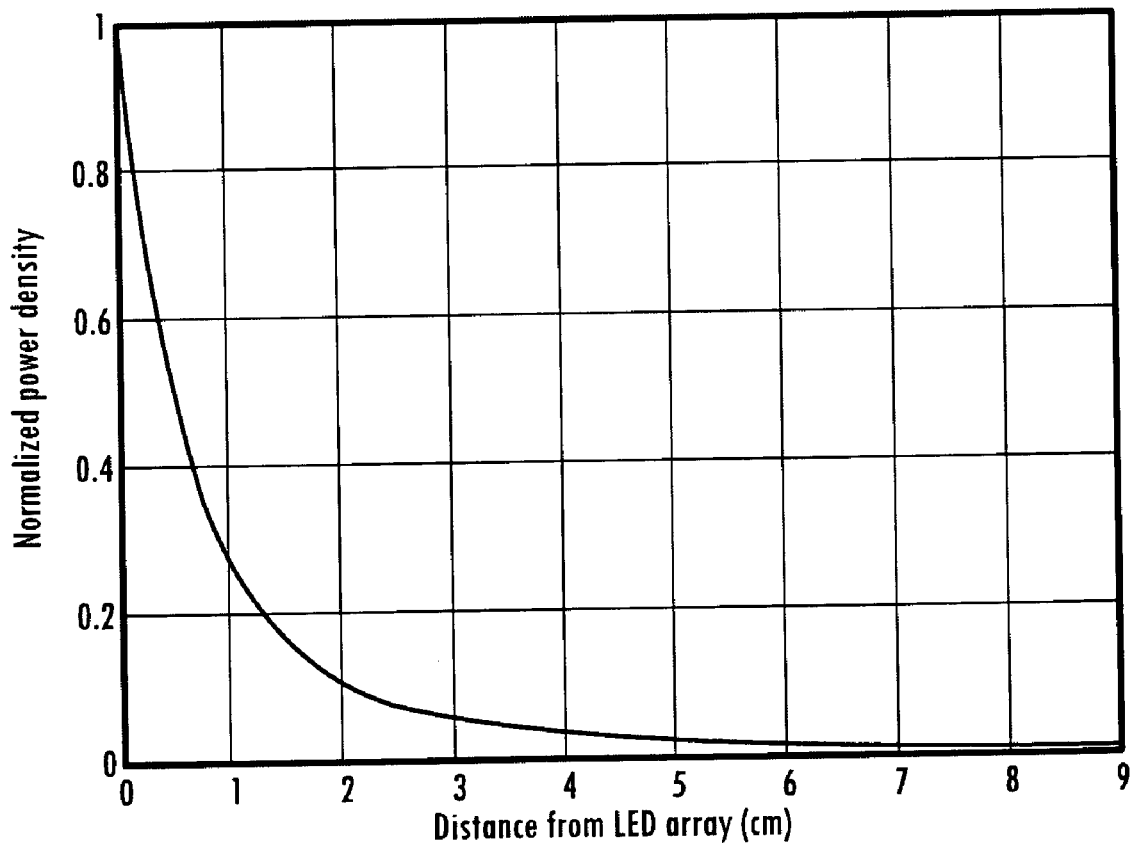
FIG. 2 shows a graph of an example of power drop-off as a function of distance from the LED array for a specific array.
Figure 3:
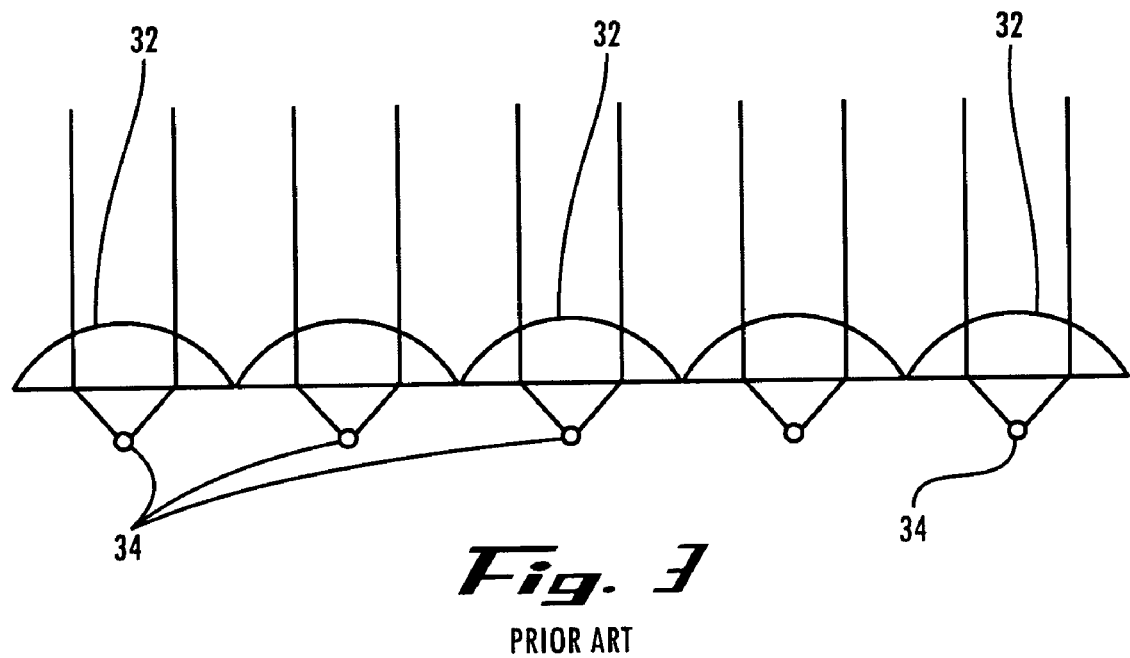
FIG. 3 shows an example of prior art refractive lenses used to collect and collimate light from an array of LEDs.
Figure 4:
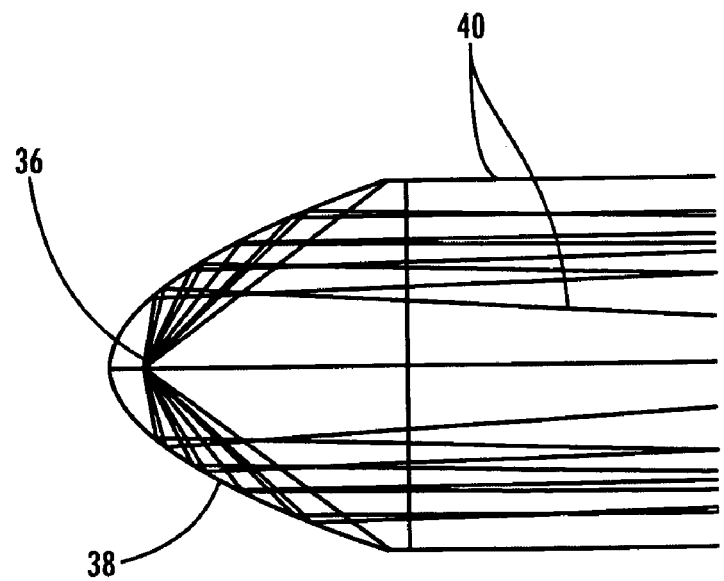
FIG. 4 shows a common approach of collecting and collimating light from an LED with a parabolic reflector.
Figure 10:
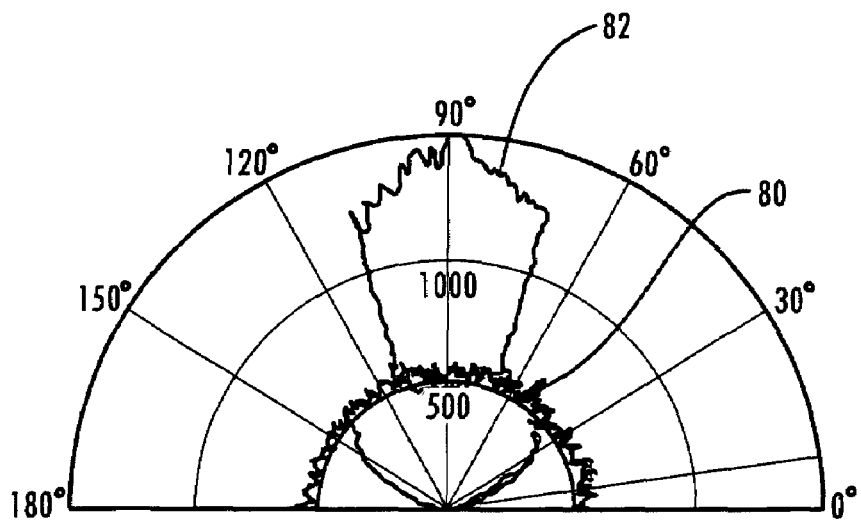
FIG. 10 is a graphic illustration showing the improved directionality of light from an LED with reflective pockets of the substrate of the invention.
Figure 11:
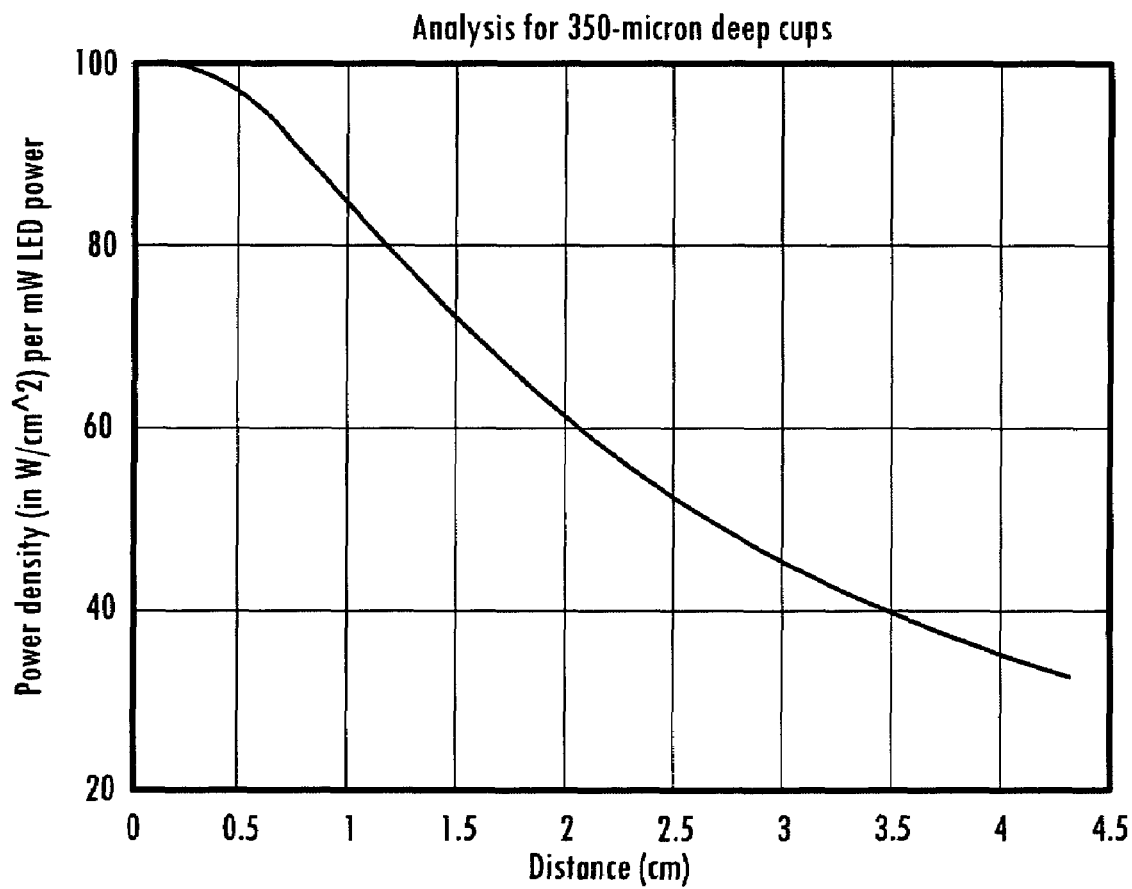
FIG. 11 is a graph of calculated power as a function of distance for an LED array arranged on a grid with 1 mm center-to-center spacing.

The LED array 50, employing micro-reflectors, provides improved collection and collimation of light emitted from the LEDs. FIG. 10 shows a graphic illustration of improved directionality in which curve 80 represents a generalized angular irradiance distribution of an LED without the use of optics (see also FIG. 1). Curve 82 represents the angular distribution of an LED after mounting into a micro-reflector formed by anisotropic etching 350 microns deep in a silicon substrate. FIG. 11 is a graphic illustration showing the calculated power as a function of distance for an array of LEDs mounted in the substrate arranged in a grid with a 1 mm center-to-center spacing. As seen by comparing the graphic illustrations of FIG. 2 and FIG. 11, the optical power density of an LED array absent micro-reflectors drops by about 50% at a distance of only about 0.5 cm (FIG. 2), whereas the optical power density of an LED array employing micro-reflectors drops by about 50% at a distance of about 2.6 cm (FIG. 11). Accordingly, an LED array employing micro-reflectors (as described herein) typically can be located relatively further away from a work surface than can an LED array without such micro-reflectors, while maintaining a substantially equivalent optical power density and, thus, enabling proper performance, particularly in certain applications.

Figure 12:
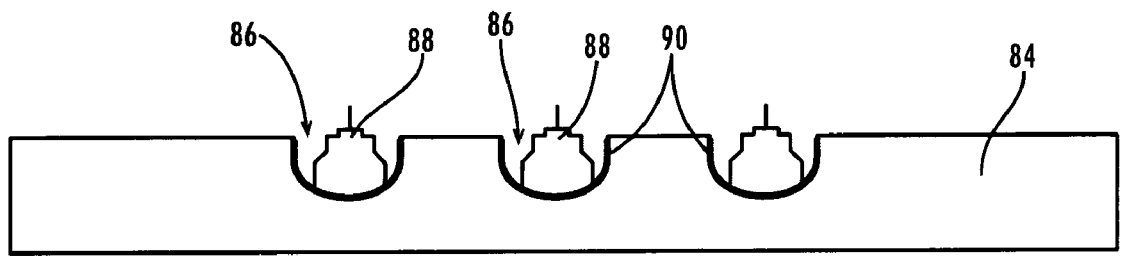
FIG. 12 is an alternative embodiment of the invention with parabolic micro-reflectors.

Micro-reflectors may be formed having various shapes. Generally, the shape is selected so as to optimize the optical power density. While parabolic micro-reflectors are typical, micro-reflectors may have other shapes. Moreover, the shapes may be varied within any particular array. As such, the micro-reflectors in the array may be patterned. To illustrate, the etched micro-reflectors in FIGS. 7-9 are shown having an inverted truncated pyramidal shape. However, FIG. 12 shows a substrate 84 formed with an array of micro-reflectors 86 having a parabolic shape. AN LED 88 is mounted in each micro-reflector as discussed above so that light from each LED 88 is reflected by layer 90. Layer 90 preferably is both a reflective and electrically conductive layer as discussed above.

The substrate may be formed of any size and the LEDs arranged in any desired dense configuration required for a particular application.

A dense LED array is also contemplated in which an array of micro-reflectors is formed using a substrate of other than silicon. Such substrate may be an insulator, a semiconductor, a conductor, or combinations of one or more of these or other materials. As examples, the substrate may be glass, ceramic, plastic, diamond, SiC, AlN, BeO, Al2O3, or combinations of these or other materials. Preferably, the substrate provides for formation of micro-reflectors, either formed in or on its surface, or some combination of both.

Micro-reflectors may be formed using various technologies. As examples, the micro-reflectors may be formed using lithographical technology, machining, stamping, casting, forging, or other processes, or combinations of one or more of these. To illustrate, micro-reflectors may be formed by machining openings (e.g., via lasers and/or plasma). To further illustrate, micro-reflectors may be formed by a combination of etching, together with machining or other technology. In this further illustration, a substrate is etched to form openings. Each opening is then machined to a desired shape, such as a parabolic shape. Such machining may be performed before or after the substrate, including the openings, is coated with a reflective material.

Figure 13:
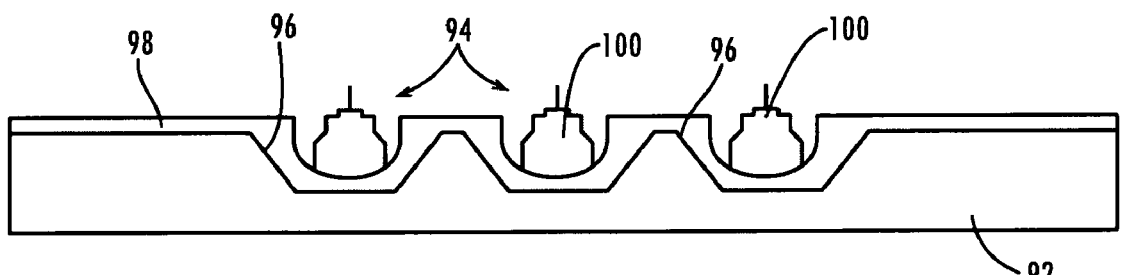
FIG. 13 is yet another embodiment of the invention in which the micro-reflectors are formed by a combination of etching and machining.

FIG. 13 shows an embodiment in which a plurality of micro-reflectors may be formed by a combination of etching and other processing. Substrate 92 is formed with a plurality of micro-reflectors 94 wherein substrate 92 is first etched to form openings 96 in a manner discussed above with reference to FIGS. 7-9. A layer of reflective (and, preferably, electrically conductive) material 98 is applied to substrate 92, including in the openings 96. The openings 96 are then processed, e.g., machined, so as to have a selected shape or shapes. As shown, the shapes are parabolic, but it is understood that other shape(s) may be employed (e.g., faceted). Additional metallization layers may then be applied (e.g., if machining removes undesirable amounts of metal). Further processing of the openings 96 may be performed (e.g., stamping to form the desired shape(s) within the openings 96). In doing such additional processing after the etching operation, not only are the micro-reflectors 94 are formed, but also the achievement of the desired shape(s) of such reflectors tends to be enhanced. A plurality of LEDs 100 are then mounted within the micro-reflectors 94 in the manner discussed above.

Although this description focuses on forming openings disposed in a selected substrate, it should be understood that a selected material may be layered on the surface of the substrate and openings may be formed in such material, without entering the substrate. It is also contemplated that the openings may be formed in such material, while yet entering the substrate.

Figure 14:
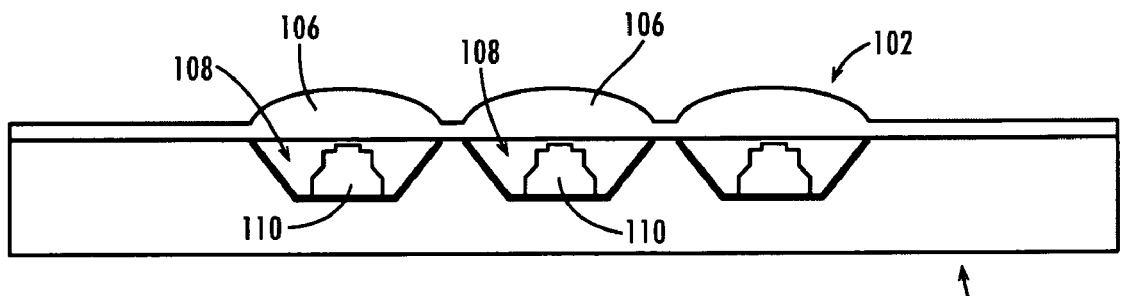
FIG. 14 is another embodiment of the invention incorporating an array of micro-lenses.

In another embodiment as seen in FIG. 14, directionality of light can be further improved by molding or aligning a microlens array 102 over an LED array 104 similar to those of FIGS. 7-9, 12, and 13. In this embodiment, each microlens 106 is associated with a micro-reflector 108 to further collect and collimate light from an associated LED 110. One type of microlens array is shown and described in PCT Appl. No. PCT/US04/36370, filed Nov. 1, 2004, the contents of which are hereby incorporated by reference in its entirety for all purposes.

The present invention provides for a method of manufacturing an array module in which a substrate is metallized. Electrical circuits are structured on the metallized substrate and the substrate is etched to form openings. The openings are metallized to form micro-reflectors that reflect light (and, preferably, that provide electrical connection for an associated semiconductor device). This enables the formation of features in the electrical circuit separately from the etching and plating tasks associated with forming the micro-reflectors.

Persons skilled in the art will recognize that many modifications and variations are possible in the details, materials, and arrangements of the parts and actions which have been described and illustrated in order to explain the nature of this invention and that such modifications and variations do not depart from the spirit and scope of the teachings and claims contained therein.

What is claimed:

1. An optical array module, comprising:
a thermally conductive and electrically insulative substrate;
a plurality of micro-reflectors arranged in an M×N array, M>1 and N>1, and a plurality of light-emitting semiconductor devices arranged on the substrate, wherein a selected number of such plurality of semiconductor devices are disposed on and associated with each such micro-reflector, and wherein light emitted from such selected number of semiconductor devices is substantially collected by the associated micro-reflectors so as to enhance the optical power density from the semiconductor devices; and
wherein each micro-reflector comprises a layer of conductive material, the conductive material providing electrical connection for an associated semiconductor device.

2. The optical array module of claim 1, wherein the micro-reflectors are arranged in an array having a center-to-center spacing of about 3 mm or less.

3. The optical array module of claim 1, wherein a side of each micro-reflectors is about 700 square microns.

4. The optical array module of claim 1, wherein each micro-reflector is formed in a truncated pyramidal shape.

5. The optical array module of claim 4, the substrate having a plurality of openings in its surface, the openings being substantially square at the surface, and having sidewalls cut into the substrate that slope to a base, so as to create a truncated pyramidal shape and wherein each such opening provides for formation of a respective one micro-reflector.

6. The optical array module of claim 1, wherein each micro-reflector has a parabolic shape.

7. The optical array module of claim 1, further including an array of micro-lenses, and one or more micro-reflectors is associated with a respective micro-lens, in connection with collection and collimation of light emitted from one or more selected semiconductor devices located within the associated micro-reflector.

8. The optical array module of claim 1, wherein the micro-reflector includes a layer of reflective and conductive material, such reflective material reflecting selected wavelength(s) of light from one or more selected semiconductor devices located within the associated micro-reflector.

9. The optical array module of claim 8, wherein the reflective and conductive material includes silver or aluminum, whereby selected wavelength(s) in the UV spectra are reflected.

10. The optical array module of claim 8, wherein the reflective and conductive material includes gold, whereby selected wavelength(s) in the visible spectra are reflected.

11. The optical array module of claim 1, further comprising a material layered on such substrate, the material having a plurality of openings in its surface, wherein each such opening provides for formation of a respective one micro-reflector.

12. The optical array module of claim 11, wherein the openings enter the substrate.

13. The optical array module of claim 1, wherein the micro-reflector includes a layer of reflective material, such reflective material and the conductive material being the same layer.

14. The optical array module of claim 1 wherein the substrate comprises one or more of ceramic, plastic, diamond, SiC, AlN, BeO, $Al_2O_3$.

* * * * *